(12) United States Patent
Steurer et al.

(10) Patent No.: US 12,334,253 B2
(45) Date of Patent: Jun. 17, 2025

(54) SYSTEMS AND METHODS FOR LEADLESS POWER COUPLING FOR CRYOGENIC ENVIRONMENTS

(71) Applicant: The Florida State University Research Foundation, Inc., Tallahassee, FL (US)

(72) Inventors: Michael Steurer, Tallahassee, FL (US); Lukas Graber, Atlanta, GA (US); Sastry Pamidi, Tallahassee, FL (US); Yanjun Shi, Tallahassee, FL (US); Peter Cheatham, Tallahassee, FL (US); Chul Han Kim, Tallahassee, FL (US)

(73) Assignee: Florida State University, Tallahassee, FL (US)

( * ) Notice: Subject to any disclaimer, the term of this patent is extended or adjusted under 35 U.S.C. 154(b) by 406 days.

(21) Appl. No.: 17/548,589

(22) Filed: Dec. 12, 2021

(65) Prior Publication Data

US 2022/0392700 A1 Dec. 8, 2022

Related U.S. Application Data

(60) Provisional application No. 63/197,017, filed on Jun. 4, 2021.

(51) Int. Cl.
*H01F 38/14* (2006.01)
*B64D 27/24* (2006.01)
(Continued)

(52) U.S. Cl.
CPC ............ *H01F 38/14* (2013.01); *B64D 27/24* (2013.01); *B64D 35/02* (2013.01); *H01F 6/008* (2013.01);
(Continued)

(58) Field of Classification Search
CPC .......... H01F 38/14; H01F 6/008; H01F 27/40; H01F 6/04; H01F 6/065; H01F 2027/408;
(Continued)

(56) References Cited

U.S. PATENT DOCUMENTS 3,161,820 A * 12/1964 Chumakov ............... G05F 1/32
363/69
3,214,679 A * 10/1965 Richards ................. H01F 36/00
336/200

(Continued)

FOREIGN PATENT DOCUMENTS

CN 103595137 A * 2/2014
KR 20190063084 A * 6/2019 ............. H01F 38/14
WO WO-2020218525 A1 * 10/2020 ............. B64D 27/10

OTHER PUBLICATIONS

Machine Translation of CN 103595137.*

*Primary Examiner* — Thienvu V Tran
*Assistant Examiner* — Yahveh Comas Torres
(74) *Attorney, Agent, or Firm* — FisherBroyles LLP; Anthony J DoVale; James Pohl (57) ABSTRACT

In examples, provided are leadless power couplers that include (1) a thermal insulating system having an outer wall and an inner wall, (2) a first electrically conductive winding located outside the thermal insulating system, where the first electrically conductive winding is configured to create a varying magnetic field, (3) a plurality of second electrically conductive windings located inside the thermal insulating system and configured to couple to the varying magnetic field, the plurality of second electrically conductive windings being superconductors, (4) a plurality of cryogenic rectifiers, each cryogenic rectifier being coupled to a respective second electrically conductive winding in the plurality of second electrically conductive windings, and (5) a plurality of cryogenic cables coupled between respective out- (Continued)

puts of the plurality of cryogenic rectifiers and respective loads.

19 Claims, 6 Drawing Sheets

(51) Int. Cl.
| | |
|---|---|
| *B64D 35/02* | (2006.01) |
| *H01F 6/00* | (2006.01) |
| *H01F 6/04* | (2006.01) |
| *H01F 6/06* | (2006.01) |
| *H01F 27/40* | (2006.01) |
| *H02J 50/10* | (2016.01) |
| *H02K 55/00* | (2006.01) |
| *H05K 7/14* | (2006.01) |

(52) U.S. Cl.
CPC .............. *H01F 27/40* (2013.01); *H02J 50/10* (2016.02); *H02K 55/00* (2013.01); *B64D 2221/00* (2013.01); *H01F 6/04* (2013.01); *H01F 6/065* (2013.01); *H01F 2027/408* (2013.01); *H05K 7/1492* (2013.01)

(58) Field of Classification Search
CPC .. H01F 6/005; H01F 6/06; H01F 36/00; H02J 50/10; H02K 55/00; H02K 9/19; H02K 1/12; H05K 7/1492; B64D 27/24; B64D 35/02; B64D 2221/00
See application file for complete search history.

(56) References Cited

U.S. PATENT DOCUMENTS

| | | | | |
|---|---|---|---|---|
| 5,965,959 | A  * | 10/1999 | Gamble | H01F 6/005 |
| | | | | 335/216 |
| 6,420,842 | B1 * | 7/2002 | Gold | H02H 7/06 |
| | | | | 318/141 |
| 2013/0288621 | A1 * | 10/2013 | Pennisi | H02J 50/20 |
| | | | | 455/127.1 |
| 2016/0305991 | A1 * | 10/2016 | Nicholson | G06F 1/28 |
| 2017/0340477 | A1 * | 11/2017 | Greene | A61F 7/0053 |
| 2018/0287407 | A1 * | 10/2018 | Sayre | H01F 30/04 |
| 2019/0020225 | A1 * | 1/2019 | Kwon | H02J 50/40 |
| 2021/0083591 | A1 * | 3/2021 | Trubnikov | H02J 50/10 |
| 2021/0335535 | A1 * | 10/2021 | Cong | H01F 38/14 |
| 2022/0216779 | A1 * | 7/2022 | Iwakuma | H02K 55/00 |

* cited by examiner

SYSTEMS AND METHODS FOR LEADLESS POWER COUPLING FOR CRYOGENIC ENVIRONMENTS

CROSS-REFERENCE TO RELATED APPLICATIONS

This application claims the benefit of and priority to U.S. Provisional Patent Application No. 63/197,017, filed Jun. 4, 2021 and titled "SYSTEMS AND METHODS FOR LEADLESS POWER COUPLING FOR CRYOGENIC ENVIRONMENTS", the disclosure of which is hereby incorporated by reference herein in its entirety.

BACKGROUND

There is increasing demand for improved techniques to efficiently distribute very large quantities of electric power. For example, server farms may continuously cumulatively require tens or even hundreds of megawatts of electrical power to power thousands of servers. Conventional techniques for powering these loads include using cables and bus bars that are very large and very heavy, in some cases requiring reinforced building structures to support the weights of the cables and the bus bars.

Accordingly, there are previously unaddressed and long-felt industry needs for methods and apparatus which improve upon conventional methods and apparatus.

SUMMARY

This summary provides a basic understanding of some aspects of the present teachings. This summary is not exhaustive in detail, and is neither intended to identify all critical features, nor intended to limit the scope of the claims.

Example methods and apparatus for leadless power coupling for cryogenic environments are provided.

In some examples, a leadless power coupler for a cryogenic environment can include (1) a first thermal insulating system having a wall defining a cavity therebetween, (2) a first electrically conductive winding located outside of the first thermal insulating system, where the first electrically conductive winding is configured to create a varying magnetic field, (3) a plurality of second electrically conductive windings located inside the first thermal insulating system (e.g., located inside the cavity) and configured to couple to the varying magnetic field, where the plurality of second electrically conductive windings are superconductors, (4) a plurality of cryogenic rectifiers, where each cryogenic rectifier is coupled to a respective second electrically conductive winding in the plurality of second electrically conductive windings, and (5) a plurality of cryogenic cables coupled between respective outputs of the plurality of cryogenic rectifiers and respective loads.

In some examples, the wall can include a material that is not electrically conductive, such as at least one of fiberglass, epoxy, porcelain, carbon fiber, or a composite thereof.

In some embodiments, the first electrically conductive winding can be at ambient temperature.

In some examples, a first number of windings in the first electrically conductive winding and a second number of windings in the plurality of second electrically conductive windings has a ratio of 5:1 or greater.

In some embodiments, the first electrically conductive winding and the plurality of second electrically conductive windings can be at least one of cylindrical windings, flat windings, or pancake coil windings.

In some examples, no electrical conductors couple, through the wall, the first electrically conductive winding to the plurality of second electrically conductive windings.

In some examples, (1) the first thermal insulating system can be configured thermally in a bus topology and (2) the first electrically conductive winding, the plurality of second electrically conductive windings, the plurality of cryogenic rectifiers, and the plurality of superconducting direct current cables can be configured electrically in a star topology with the first electrically conductive winding at a center of the star topology.

In some examples, the respective loads can be located outside of the first thermal insulating system (e.g., outside of the cavity). In some embodiments, the respective loads can include a rack-mounted power distribution unit, a computer, a superconducting magnet including coils of superconducting wire, a motor, or a combination thereof. In some examples, the respective loads can be configured to normally operate at ambient (e.g., non-cryogenic) temperature.

In some embodiments, the leadless power coupler for the cryogenic environment can include a circuit breaker coupled between (1) a respective second electrically conductive winding in the plurality of second electrically conductive windings and (2) a cryogenic rectifier in the plurality of cryogenic rectifiers.

In some examples, the leadless power coupler for the cryogenic environment can include a second thermal insulating system, where the first electrically conductive winding is located inside of the second thermal insulating system.

In some embodiments, the leadless power coupler for the cryogenic environment can include a frequency upconverter coupled to the first electrically conductive winding and configured to increase a frequency of an alternating current input to the first electrically conductive winding.

In some examples, the leadless power coupler for the cryogenic environment can include: (1) an aircraft wing, where at least a portion of the first thermal insulating system is located inside the aircraft wing and (2) an aircraft electric propulsion motor, where the electric propulsion motor is a respective load in the respective loads.

In some examples, provided are methods for supplying electrical power via leadless power couplers for cryogenic environments. In some examples a method for supplying electrical power via a leadless power coupler for a cryogenic environment can include: (1) applying an input alternating current through a first electrically conductive winding to create a varying magnetic field, where the first electrically conductive winding is located outside of a thermal insulating system and the thermal insulating system includes a wall, (2) inducing, using the varying magnetic field, a plurality of output alternating currents in a plurality of respective second electrically conductive windings, where the plurality of second electrically conductive windings are located inside the thermal insulating system and the plurality of second electrically conductive windings are in a superconducting state, (3) rectifying, using a plurality of cryogenic rectifiers, the plurality of output alternating currents into a plurality of respective direct currents, where each cryogenic rectifier is coupled to a respective second electrically conductive winding in the plurality of second electrically conductive windings, and (4) conducting the plurality of respective direct currents to respective loads via a plurality of respective cryogenic cables coupled between respective outputs of the plurality of cryogenic rectifiers and the respective loads.

In some examples, the method for supplying electrical power via a leadless power coupler for a cryogenic environment can include increasing a frequency of the input alternating current prior to applying the input alternating current through the first electrically conductive winding.

In some examples, a respective load in the respective loads can be at least one of a superconducting motor or a superconducting generator, and the method for supplying electrical power via a leadless power coupler for a cryogenic environment can further include conducting a respective direct current in the respective direct currents to a brushless exciter of at least one of the superconducting motor or the superconducting generator.

The foregoing broadly outlines some of the features and technical advantages of the present teachings so the detailed description and drawings can be better understood. Additional features and advantages are also described in the detailed description. The conception and disclosed examples can be used as a basis for modifying or designing other devices for carrying out the same purposes of the present teachings. Such equivalent constructions do not depart from the technology of the teachings as set forth in the claims. The inventive features characteristic of the teachings, together with further objects and advantages, are better understood from the detailed description and the accompanying drawings. Each of the drawings is provided for the purpose of illustration and description only and does not limit the present teachings.

BRIEF DESCRIPTION OF THE DRAWINGS

The accompanying drawings are presented to describe examples of the present teachings and are not limiting.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Provided are methods and apparatuses which leadlessly couple power for cryogenic environments.

Cryogenic electric power distribution systems can supply very large quantities of electric power to multiple loads. These systems can beneficially use cryogenic conductors having extremely low electrical resistance to transport large quantities of current, thus resulting in very little energy loss due to heating. One of the challenges with cryogenic power apparatus, such as cryogenic cables and cryogenic electric power distribution systems, is a transition of higher voltages from ambient temperature to a cryogenic environment. Conventional techniques may use a current carrying conductor in a form of a metallic feedthrough which provides a metallic connection between a power system at ambient temperature and the cryogenic electric power distribution system at cryogenic temperature. These metallic feedthroughs may be significant conductors of heat into the cryogenic environment. The provided methods and apparatus address and improve upon these concerns by coupling the electrical power via varying magnetic fields instead of by using a metallic feedthrough. In some examples are provided techniques that can, unlike metallic feedthroughs, also increase and or decrease alternating current voltages.

The examples disclosed hereby advantageously address the long-felt industry needs, as well as other previously unidentified needs, and mitigate shortcomings of conventional techniques. Some of the provided examples can advantageously transfer very large quantities of power across a thermal insulating system wall without penetrating the thermal insulating system wall. The provided examples can advantageously transfer very large quantities of power across a thermal insulating system wall without a metallic feedthrough. Metallic feedthroughs can be a major heat conduction path. Among other advantages, an advantage provided by some examples is a reduction in weight compared to conventional apparatus for a given power transmission capacity. Another advantage provided by the examples is a reduction in physical size compared to conventional apparatus for a given power transmission capacity. Some of the provided examples advantageously can decrease heat generated inside a building containing a thermal insulating system, which in turn can decrease air conditioning requirements, thus reducing equipment expenses, reducing maintenance expenses, and reducing space used by air conditioning equipment.

Further, examples of the provided systems and methods described herein can beneficially and advantageously improve a functioning of devices configured to deliver electric power using a thermal insulating system.

Numerous examples are disclosed in this application's text and drawings. Alternate examples can be devised without departing from the scope of this disclosure. Additionally, conventional elements of the current teachings may not be described in detail, or may be omitted, to avoid obscuring aspects of the current teachings. This description provides, with reference to the figures, detailed descriptions of example apparatus and methods.

Figure 1:
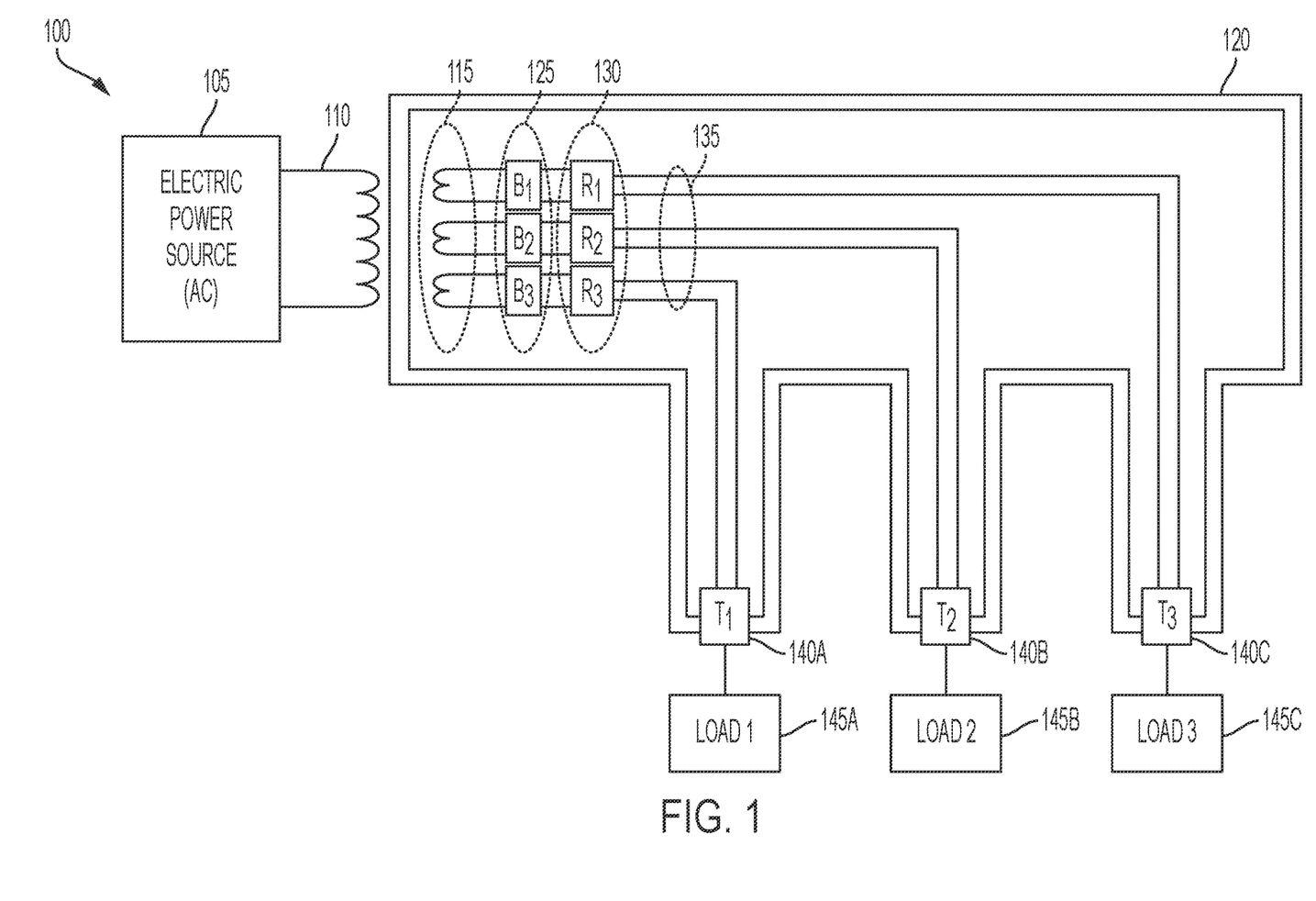
FIG. 1 depicts a non-limiting example of a leadless power coupler for a cryogenic environment.

FIG. 1 depicts a non-limiting example of a leadless power coupler 100 for a cryogenic environment. The leadless power coupler 100 can convert higher voltage alternating current (AC) into lower voltage direct current (DC) and distribute the lower voltage DC to multiple loads.

In a non-limiting example, the leadless power coupler 100 can include an electric power source 105, a first electrically conductive winding 110, a plurality of second electrically conductive windings 115, a thermal insulating system 120, a respective plurality of circuit breakers 125, a respective plurality of cryogenic rectifiers 130, a respective plurality of cryogenic cables 135, a respective plurality of terminations 140A-C, and respective loads 145A-C. Although three loads are depicted in FIG. 1, this example is non-limiting. Any practicable number of loads can be powered by the leadless power coupler 100 of FIG. 1. Any practicable number of loads can be powered by the electric power distribution system 250 of FIG. 2B.

In some non-limiting examples, the electric power source 105 can be a source of electric power such as a generator, an electric power distribution system, an electric power grid, a substation, the like, or a combination thereof. In some examples, an electric power utility can provide the electric power source 105. In examples, the electric power source 105 can be configured to supply alternating current electric power at a frequency between 47 Hz and 63 Hz. In non-limiting examples, the electric power source 105 can be configured to supply alternating current electric power at a frequency between 375 Hz and 425 Hz. In some non-limiting examples, the electric power source 105 can be configured to supply electric power at a frequency higher than 63 Hz, such as 100 Hz, 800 Hz, or higher, as is practicable to serve a specific load. In an example, electric power source 105 can be configured to supply electric power at a voltage greater than 110 VAC.

In a nonlimiting example, the electric power source 105 can be coupled to an input of a frequency upconverter. The frequency upconverter can increase the frequency of alternating current supplied to the first electrically conductive winding 110. For example, the frequency upconverter can convert alternating current having a frequency between 47 Hz and 63 Hz to alternating current having a frequency greater than 63 Hz. In another example, the frequency upconverter can output alternating current having a frequency between 375 Hz and 425 Hz (e.g., for use in aircraft). As the frequency of the alternating current increases, the size of the first electrically conductive winding 110 and the size of the second electrically conductive windings 115 decrease, thus advantageously saving materials, weight, and space.

In some examples, the at least one frequency upconverter can increase the frequency of alternating current supplied to the first electrically conductive winding 110. The at least one frequency upconverter can be physically located in the thermal insulating system 120. In a nonlimiting example, at least one frequency upconverter can be coupled between at least one respective second electrically conductive winding in the plurality of second electrically conductive windings 115 and at least one respective load in the respective loads 145A-C. In some examples, the at least one frequency upconverter can be located physically and electrically between a termination (e.g., termination 140A) and a load (e.g., load 145A).

In some examples, the first electrically conductive winding 110 can operate at ambient temperature (e.g., between 0° C. and 50° C.). The first electrically conductive winding 110 can be at least one of a cylindrical winding, a flat winding, or a pancake coil winding. In a nonlimiting example, the first electrically conductive winding 110 can be located in a second thermal insulating system (e.g., in a separate cryostat). The second thermal insulating system can be physically located adjacent to the thermal insulating system 120 such that a varying magnetic field generated by current flow through the first electrically conductive winding 110 can couple to the plurality of second electrically conductive windings 115.

The plurality of second electrically conductive windings 115 are located within the thermal insulating system 120. The plurality of second electrically conductive windings 115 can be coupled to the respective plurality of circuit breakers 125 (also identified as B1, B2, B3). In some examples, the plurality of second electrically conductive windings 115 can be formed of superconducting material. In some examples, the plurality of second electrically conductive windings 115 can operate at any temperatures between 0 K and 200 K. The plurality of second electrically conductive windings 115 can be at least one of cylindrical windings, flat windings, or pancake coil windings. In some examples, the plurality of second electrically conductive windings 115 are electrically separate windings that are not taps off of a common winding.

In an example, the first electrically conductive winding 110 and the plurality of second electrically conductive windings 115 can be magnetically coupled via a core. In some examples, the core is an air core. In some examples, at least one portion of the core is formed of a material having a high magnetic permeability. The core can be arranged (e.g., located, shaped, or both) in a manner to guide a magnetic field generated by the first electrically conductive winding 110 to the plurality of second electrically conductive windings 115. The core can have a split core arrangement, in which a first portion of the core is located outside of the thermal insulating system 120 and a second portion of the core is located inside of the thermal insulating system 120. In an example, the entirety of the plurality of second electrically conductive windings 115 can be served by a common core. In some examples, at least two second electrically conductive windings in the plurality of second electrically conductive windings 115 can be served by respective core portions that are not in direct physical contact.

In a non-limiting example, a first number of windings in the first electrically conductive winding 110 and a second number of windings in the plurality of second electrically conductive windings 115 has a ratio of 5:1 or greater. In an example, a first number of windings in the first electrically conductive winding 110 and a second number of windings in the plurality of second electrically conductive windings 115 can be configured to convert an alternating current greater than 500 volts input to the first electrically conductive winding 110 to an alternating current less than 72 volts output from a respective second electrically conductive winding in the plurality of second electrically conductive windings 115. In an example application for use as a part of an aircraft, a first number of windings in the first electrically conductive winding 110 and a second number of windings in the plurality of second electrically conductive windings 115 can be configured to convert an alternating current greater than 10 kV input to the first electrically conductive winding 110 to an alternating current between 1 kV to 5 kV output from a respective second electrically conductive winding in the plurality of second electrically conductive windings 115.

In some examples, the thermal insulating system 120 can maintain an internal refrigerant, such as liquid nitrogen, liquid helium, cold gaseous nitrogen, or cold gaseous helium in a cold state. Components located inside the thermal insulating system 120 can operate at any temperatures between 0 K and 250 K (e.g., in a cryogenic state). In a nonlimiting example, the thermal insulating system 120 can include a thermal insulating container having at least one wall defining a first cavity therein, such as a cryostat. In some examples, the thermal insulating system 120 can include a single wall, while in some examples the thermal insulating system 120 can include multiple walls, such as an outer wall and an inner wall. The inner wall and the outer wall can define a second cavity located therebetween. The second cavity can contain a vacuum as a thermal insulator.

In some examples where the thermal insulating system 120 includes a single wall, no electrical conductors couple, through the single wall, the first electrically conductive winding 110 to the plurality of second electrically conductive windings 115. In some examples, no electrical conductors couple, through the second cavity, the first electrically conductive winding 110 to the plurality of second electrically conductive windings 115. At least a portion of a wall of the thermal insulating system 120 can be formed of a material that is highly electrically resistive (e.g., with resistance of 1 Mohm or greater), such as at least one of fiberglass, epoxy, porcelain, carbon fiber, or a composite thereof.

The leadless power coupler 100 is not limited to including only one thermal insulating system. In some examples, devices depicted in FIG. 1 as being located within the thermal insulating system 120 can be grouped or independently located within their own respective thermal insulating systems. For example, the plurality of second electrically conductive windings 115 can be located in a first thermal insulating system, while the respective plurality of circuit breakers 125 can be located in a second thermal insulating system.

In another example, a first conductive winding in the plurality of second electrically conductive windings 115, a first circuit breaker in the respective plurality of circuit breakers 125, and a first cryogenic rectifier 130 in the respective plurality of cryogenic rectifiers 130 can be located in a first thermal insulating system, while a second electrically conductive winding in the plurality of second electrically conductive windings 115, a second circuit breaker in the respective plurality of circuit breakers 125, and a second cryogenic rectifier in the respective plurality of cryogenic rectifiers 130 can be located in a second thermal insulating system.

The respective plurality of circuit breakers 125 are safety devices that can open a respective electric circuit during a period in which current through the respective electric circuit exceeds a threshold quantity. The respective plurality of circuit breakers 125 can be coupled between the respective second electrically conductive windings 115 and the plurality of cryogenic rectifiers 130.

The respective plurality of cryogenic rectifiers 130 can be configured to rectify alternating current into direct current to meet direct current requirements of loads. The respective plurality of cryogenic rectifiers 130 can be optional. The cryogenic rectifiers 130 can be configured to operate in a cryogenic state. During operation in the cryogenic state, the cryogenic rectifiers 130 operate in a low power loss condition. In some examples, the respective plurality of cryogenic rectifiers 130 can be formed of a low resistance material to advantageously reduce heating resulting from the rectification process and resistive losses.

In some examples, the respective plurality of cryogenic rectifiers 130 can be configured to rectify an input alternating current into direct current having a voltage greater than 0 VDC and less than 50 VDC. In a nonlimiting example, the respective plurality of cryogenic rectifiers 130 can be configured to rectify the input alternating current into direct current having a voltage of 2 VDC.

Each cryogenic rectifier in the respective plurality of cryogenic rectifiers 130 can be coupled to a respective second electrically conductive winding in the plurality of second electrically conductive windings 115. In some embodiments, the plurality of second electrically conductive windings 115 can be coupled to the respective plurality of cryogenic rectifiers 130 by current carrying cables that can be fabricated of aluminum, copper, an aluminum alloy, a copper alloy, a superconductor, or combination thereof. In some non-limiting examples, at least one of the cryogenic rectifiers 130 can be located adjacent to a respective second electrically conductive winding in the plurality of second electrically conductive windings 115.

The respective plurality of cryogenic cables 135 can be configured to deliver direct current from the respective plurality of cryogenic rectifiers to a respective plurality of terminations 140A-C. The respective plurality of cryogenic cables 135 can be a bundle of electrical conductors. The cryogenic cables 135 can be configured to operate in a cryogenic state. During operation in the cryogenic state, cryogenic cables 135 operate in a low power loss condition. In some examples, the cryogenic cables 135 can be formed of a superconducting material to advantageously reduce heating due to resistive losses. Thus, in some examples, the cryogenic cables 135 can operate in a superconducting state. The respective plurality of cryogenic cables 135 can be configured in a variety of electrical network topologies as described herein with reference to FIGS. 2A-B.

The respective plurality of terminations 140A-C can be configured to transport lower voltage DC current through a wall of the thermal insulating system 120.

In some examples, the respective loads 145A-C can be located inside or outside of the thermal insulating system 120. In some embodiments, the respective loads 145A-C can include a rack-mounted power distribution unit, a computer, a superconducting magnet including coils of superconducting wire, a motor, or a combination thereof. In some embodiments, the respective loads 145A-C can include a quantum computing device. In some embodiments, the quantum computing device can be located in the thermal insulating system 120. The respective loads 145A-C can include a device requiring lower voltage power. In some examples, the respective loads can be configured to normally operate at ambient temperature.

In nonlimiting example, the leadless power coupler 100 can be located inside an aircraft wing (e.g., fastened to a structural component of the aircraft wing) and can be configured to transmit power from a higher voltage alternating current power source to at least one aircraft electric propulsion motor. In an example, an aircraft electric propulsion motor can be a respective load in the respective loads 145A-C.

In operation, the electric power source 105 can supply alternating current to the first electrically conductive winding 110. The first electrically conductive winding 110 can be generate a varying magnetic field which couples to the plurality of second electrically conductive windings 115. The plurality of cryogenic rectifiers 130 convert alternating currents supplied by the plurality of second electrically conductive windings 115 into a respective plurality of direct currents. The respective plurality of direct currents can be conducted via the respective plurality of cryogenic cables 135 to the respective plurality of terminations 140A-C. The respective plurality of terminations 140A-C in turn couple the respective plurality of direct currents to the respective loads 145A-C to power the respective loads 145A-C.

Figure 2A:
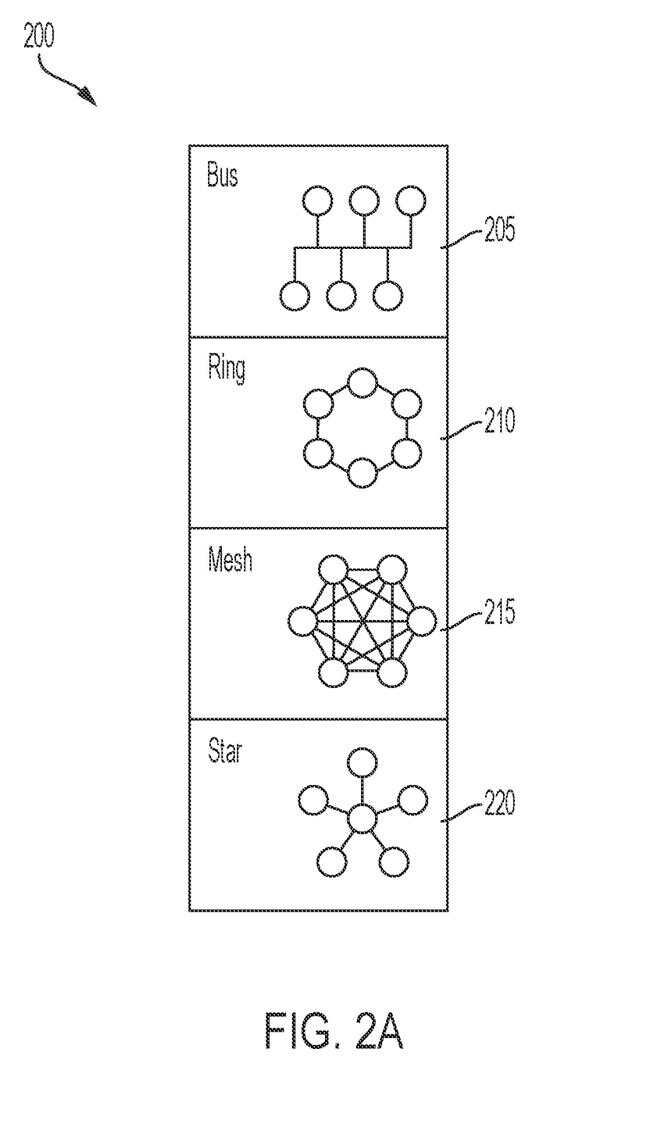
FIG. 2A depicts non-limiting examples of electrical and thermal network topologies.

FIG. 2A depicts non-limiting examples of electrical and thermal network topologies 200.

Electrical networks can be configured in a variety of different electrical network topologies. For example, FIG. 2A depicts a bus topology 205, in which at least two segments are served by a mainline. Bus topologies advantageously can have segments which each have different current ratings. Another type of network topology is a ring topology 210. In the ring topology 210, each load can be supplied via two segments. Ring topologies advantageously can provide some failure tolerance. A further type of network topology is a mesh topology 215, in which sources and loads are coupled via multiple segments. Mesh topologies advantageously can have scalable failure tolerance and flexible segment current ratings. An additional type of network topology is a star topology 220. In a star topology 220, each load can be supplied directly by a power source via a dedicated supply segment. Star topologies advantageously can provide a high system wide failure tolerance and can have segments which each have different current ratings.

Thermal insulating systems can be configured in a variety of different thermal network topologies. For example, the bus topology 205 advantageously can have a short cumulative physical length. The ring topology 210 can have a short cumulative physical length. The mesh topology 215 advantageously can have segments with different sizes. The star topology 220 advantageously can have segments with different sizes.

Thermal insulating systems can be configured in an open-loop or closed-loop. In the open-loop configuration, refrigerant, such as liquid nitrogen, liquid helium, cold gaseous nitrogen, or cold gaseous helium in a cold state flows from a source tank, through the thermal insulating system, and then is discharged to the atmosphere. In other words, in the open-loop configuration, the refrigerant is only used once to cool the thermal insulating system. In the closed loop configuration, the refrigerant is not discharged to the atmosphere, but instead is continuously cycled through the thermal insulating system and a heat removal system that removes heat from the refrigerant.

In some examples, electrical network topologies of the provided systems can be dissimilar from thermal network topologies of the provided systems, thus enabling combinations of configurations that advantageously can simultaneously provide both an advantageous electrical network topology and an advantageous thermal network topology. In some examples, and electrical network topology described herein can be combined with a thermal network topology as described herein.

Figure 2B:
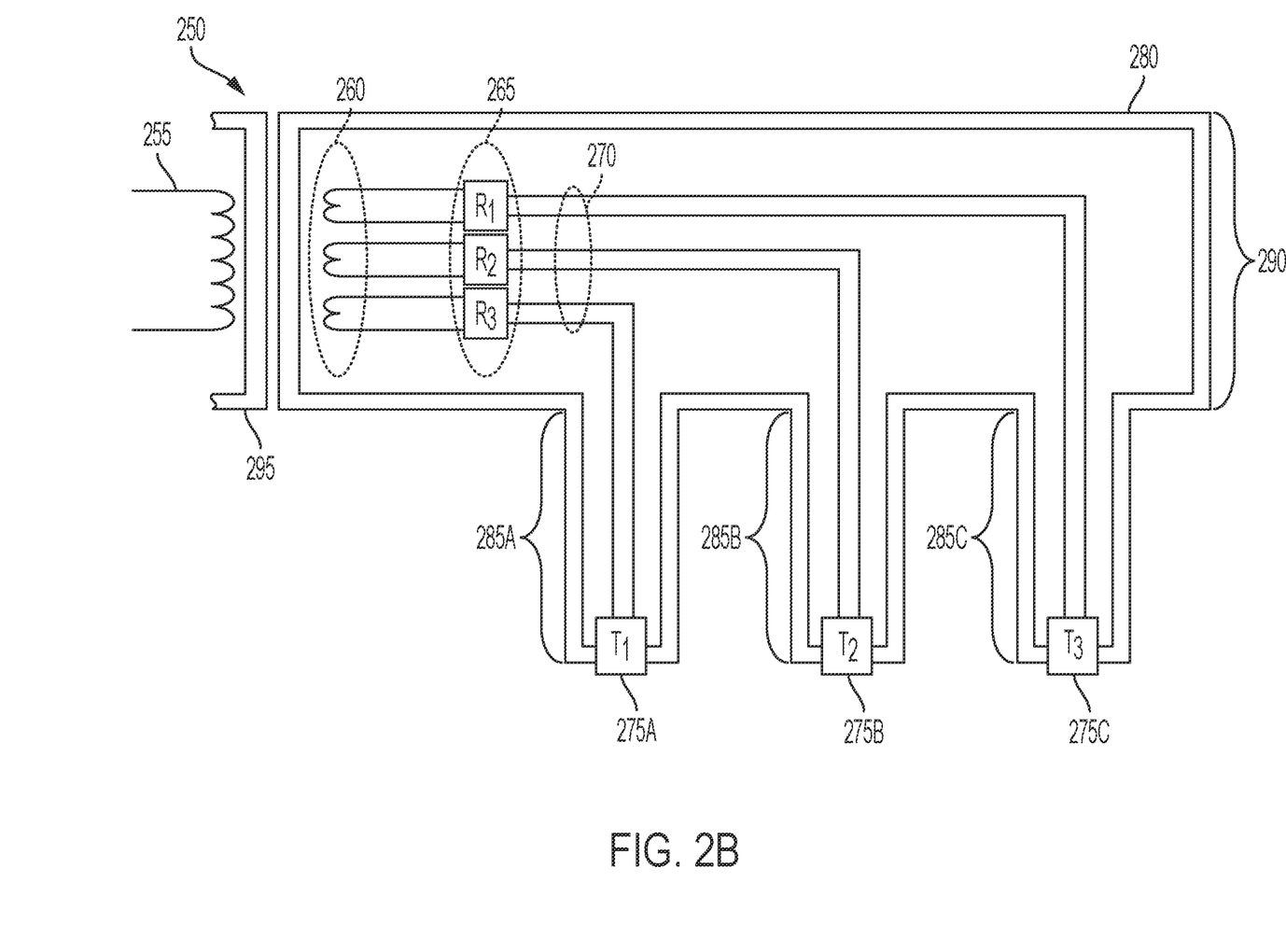
FIG. 2B depicts a non-limiting example of an electric power distribution system having dissimilar electrical and thermal network topologies.

FIG. 2B depicts a non-limiting example of an electric power distribution system 250 including dissimilar electrical and thermal network topologies. In the example of FIG. 2B, a first electrically conductive winding 255 is configured to generate a varying magnetic field which couples to a plurality of second electrically conductive windings 260. The plurality of second electrically conductive windings 260 are coupled to a respective plurality of cryogenic rectifiers 265. The plurality of cryogenic rectifiers 265 convert alternating currents provided by the plurality of second electrically conductive windings 260 into a respective plurality of direct currents. The respective plurality of direct currents can be conducted via a respective plurality of cryogenic cables 270 to a respective plurality of terminations 275A-C. The respective plurality of terminations 275A-C in turn couple the respective plurality of direct currents to respective loads. Electrically, the electric power distribution system 250 is configured in a star topology, with the first electrically conductive winding at the center of the star topology. In contrast, a thermal insulating system 280 of the electric power distribution system 250 is configured thermally in a bus topology, with segments 285A-C extending from a mainline 290 of the thermal insulating system 280. FIG. 2B also depicts a supplemental thermal insulating system 295, where the first electrically conductive winding 255 is located inside the supplemental thermal insulating system 295.

The electrical network topology of the electric power distribution system 250 can advantageously enable the respective plurality of cryogenic cables 270 to each have different current ratings. Simultaneously, the thermal network topology of the electric power distribution system 250 advantageously provides a short cumulative physical length of the thermal insulating system 280, which can reduce system costs, system weight, system size, and system maintenance expenses. Thus, combinations of configurations advantageously can simultaneously provide both an advantageous electrical network topology and an advantageous thermal network topology.

Figure 3:
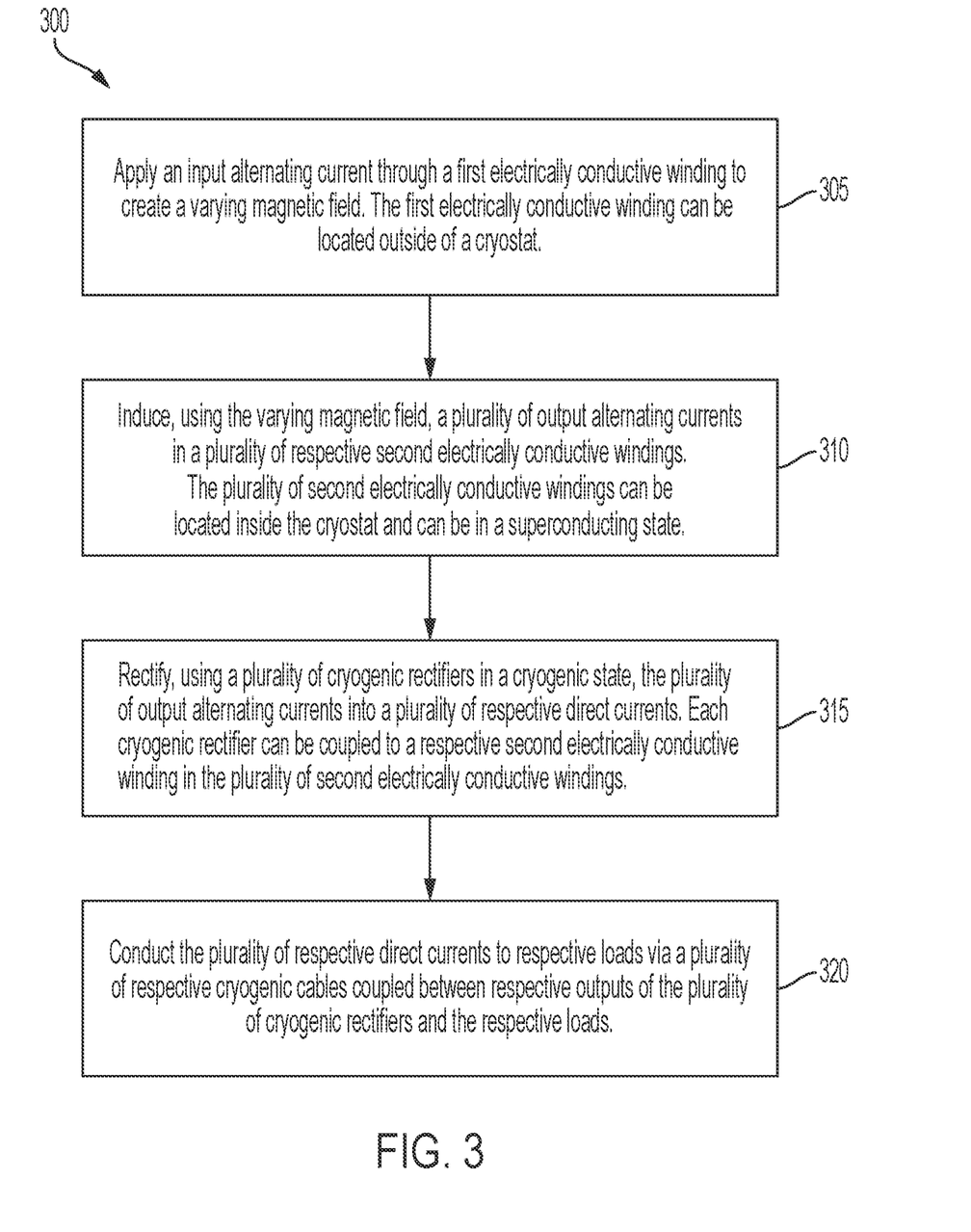
FIG. 3 depicts a non-limiting example of a method for supplying electrical power via a leadless power coupler for a cryogenic environment.

FIG. 3 depicts a non-limiting example of a method 300 for supplying electrical power via a leadless power coupler for a cryogenic environment. The method 300 can be performed by the apparatus described hereby, such as the leadless power coupler for the cryogenic environment 100 in FIG. 1.

As illustrated in FIG. 3, at block 305, one or more of the devices described herein can apply an input alternating current through a first electrically conductive winding to create a varying magnetic field. The first electrically conductive winding can be located outside of a thermal insulating system, the thermal insulating system can include a wall defining a cavity therein (e.g., a container defining a cavity therein). In an example, the method 300 can include increasing frequency of the input alternating current prior to applying the input alternating current through the first electrically conductive winding.

As illustrated in FIG. 3, at block 310, one or more of the devices described herein can induce, using the varying magnetic field, a plurality of output alternating currents in a plurality of respective second electrically conductive windings. The plurality of second electrically conductive windings can be located inside the thermal insulating system and can operate in a superconducting state.

As illustrated in FIG. 3, at block 315, one or more of the devices described herein can rectify the plurality of output alternating currents supplied by the plurality of respective second electrically conductive windings into a plurality of respective direct currents.

As illustrated in FIG. 3, at block 320, one or more of the devices described herein can conduct the plurality of respective direct currents to respective loads via a plurality of respective cryogenic cables coupled between respective outputs of the plurality of cryogenic rectifiers and the respective loads.

Figure 4:
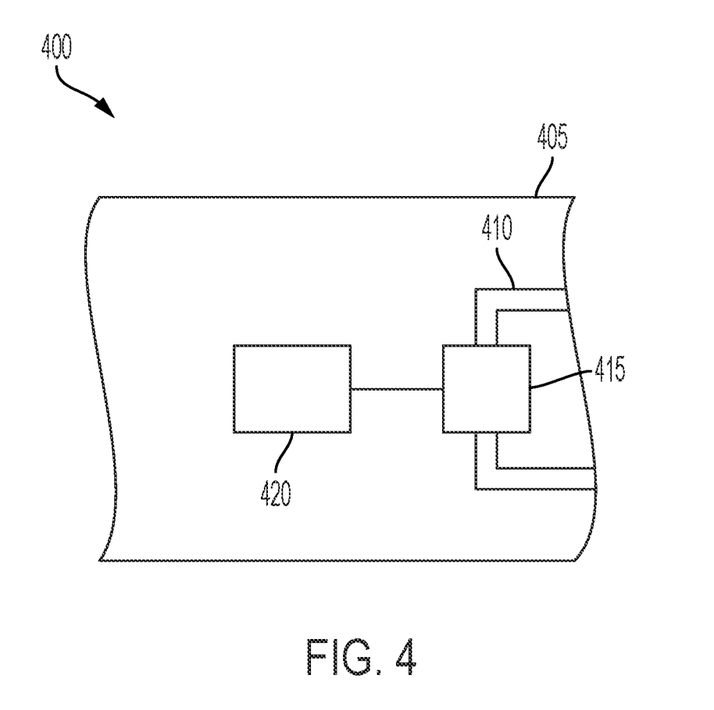
FIG. 4 depicts a non-limiting example of an aircraft wing including a leadless power coupler for a cryogenic environment.

FIG. 4 depicts a non-limiting example device 400 including an aircraft wing 405 and a leadless power coupler for a cryogenic environment. At least a portion of a thermal insulating system 410 of the leadless power coupler for the cryogenic environment can be located inside the aircraft wing 405. The leadless power coupler for the cryogenic environment can include a termination 415 via which an aircraft electric propulsion motor 420 is a respective load of the leadless power coupler for the cryogenic environment.

Figure 5:
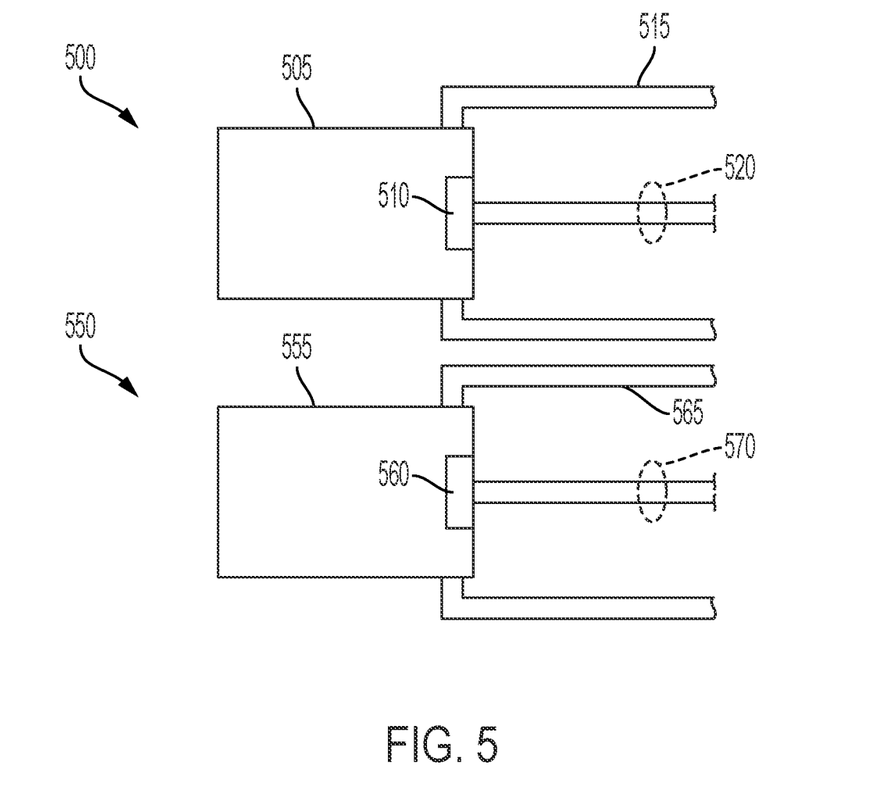
FIG. 5 depicts non-limiting example devices in which leadless power couplers for cryogenic environments are respectively coupled to a superconducting motor and a superconducting generator.

FIG. 5 depicts a first non-limiting example device 500 in which a leadless power coupler for a cryogenic environment is coupled to a superconducting motor 505. FIG. 5 also depicts a second non-limiting example device 550 in which a leadless power coupler for a cryogenic environment is coupled to a superconducting generator 555.

The first nonlimiting example device 500 includes the superconducting motor 505, a brushless exciter 510, a thermal insulating system 515 of the leadless power coupler for the cryogenic environment, and a plurality of respective cryogenic cables 520.

The second nonlimiting example device 550 includes the superconducting generator 555, a brushless exciter 560, a thermal insulating system 565 of the leadless power coupler for the cryogenic environment, and a plurality of respective cryogenic cables 570.

Thus, in an embodiment, a respective load in the respective loads can be at least one of a superconducting motor or a superconducting generator. The method 300 can include conducting a respective direct current in the respective direct currents to a brushless exciter of at least one of the superconducting motor or the superconducting generator.

It is to be understood that these inventions are not limited to the specific systems, devices, and/or methods disclosed unless otherwise specified, as such can, of course, vary. It is also to be understood that terminology used herein is for the purpose of describing particular aspects only and is not intended to be limiting.

Those skilled in the relevant art will recognize that many changes can be made to the aspects described, while still obtaining the beneficial results of the present inventions. It will also be apparent that some of the desired benefits of the present inventions can be obtained by selecting some of the features of the present inventions without utilizing other features. Accordingly, those who work in the art will recognize that many modifications and adaptations to the present inventions are possible and can even be desirable in certain circumstances and are a part of the present inventions. Thus, this description is provided as illustrative of the principles of the present inventions and not in limitation thereof.

As used hereby, the term "example" means "serving as an example, instance, or illustration". Any example described as an "example" is not necessarily to be construed as preferred or advantageous over other examples. Likewise, the term "examples" does not require all examples include the discussed feature, advantage, or mode of operation. Use of the terms "in one example," "an example," "in one feature," "a feature," or a combination thereof in this specification does not necessarily refer to the same feature, same example, or both. Furthermore, a particular feature, structure, or both can be combined with one or more other features, structures, or both. Moreover, at least a portion of the apparatus described hereby can be configured to perform at least a portion of a method described hereby.

It should be noted the terms "connected," "coupled," and any variant thereof, mean any connection or coupling between elements, either direct or indirect, and can encompass a presence of an intermediate element between two elements which are "connected" or "coupled" together via the intermediate element. Coupling and connection between the elements can be physical. Elements can be "connected" or "coupled" together, for example, by using one or more fasteners, and the like, as practicable. These are several non-limiting and non-exhaustive examples.

A reference using a designation such as "first," "second," and so forth does not limit either the quantity or the order of those elements. Rather, these designations are used as a convenient method of distinguishing between two or more elements or instances of an element. Thus, a reference to first and second elements does not mean only two elements can be employed, or the first element must necessarily precede the second element. Also, unless stated otherwise, a set of elements can comprise one or more elements. In addition, terminology of the form "at least one of: A, B, or C" or "one or more of A, B, or C" or "at least one of the group consisting of A, B, and C" used in the description or the claims can be interpreted as "A or B or C or any combination of these elements". For example, this terminology can include A, or B, or C, or A and B, or A and C, or A and B and C, or 2A, or 2B, or 2C, and so on.

The terminology used hereby is for the purpose of describing particular examples only and is not intended to be limiting. As used hereby, the singular forms "a," "an," and "the" include the plural forms as well, unless the context clearly indicates otherwise. In some examples provided hereby, the singular can portend the plural, where practicable. Further, the terms "comprises," "comprising," "includes," and "including," specify a presence of a feature, an integer, a step, a block, an operation, an element, a component, and the like, but do not necessarily preclude a presence or an addition of another feature, integer, step, block, operation, element, component, and the like.

It is intended that all matter contained in this description be interpreted as illustrative rather than in a limiting sense. While this disclosure describes examples, changes and modifications can be made to the examples disclosed hereby without departing from the scope defined by the appended claims. A feature from any of the provided examples can be used in combination with one another feature from any of the provided examples in accordance with the general principles described hereby. The present disclosure is not intended to be limited to the specifically disclosed examples alone.

What is claimed is:

1. A leadless power coupler for a cryogenic environment, comprising:
    a first thermal insulating system having a wall defining a cavity therein;
    a first electrically conductive winding located outside of the first thermal insulating system, wherein the first electrically conductive winding is configured to create a varying magnetic field;
    a plurality of second electrically conductive windings located inside the first thermal insulating system and configured to couple to the varying magnetic field, wherein the plurality of second electrically conductive windings are superconductors;
    a plurality of cryogenic rectifiers, wherein each cryogenic rectifier is coupled to a respective second electrically conductive winding in the plurality of second electrically conductive windings; and
    a plurality of cryogenic cables coupled between respective outputs of the plurality of cryogenic rectifiers and respective loads,
    wherein:
        the first thermal insulating system is configured thermally in a bus topology; and
        the first electrically conductive winding, the plurality of second electrically conductive windings, the plurality of cryogenic rectifiers, and the plurality of cryogenic cables are configured electrically in a star topology with the first electrically conductive winding at a center of the star topology.

2. The leadless power coupler for a cryogenic environment of claim 1, wherein the wall is comprised of at least one of fiberglass, epoxy, porcelain, carbon fiber, or a composite thereof.

3. The leadless power coupler for a cryogenic environment of claim 1, wherein the first electrically conductive winding is at ambient temperature.

4. The leadless power coupler for a cryogenic environment of claim 1, wherein a first number of windings in the first electrically conductive winding and a second number of windings in the plurality of second electrically conductive windings has a ratio of 5:1 or greater.

5. The leadless power coupler for a cryogenic environment of claim 1, wherein the first electrically conductive winding and the plurality of second electrically conductive windings are at least one of cylindrical windings, flat windings, or pancake coil windings.

6. The leadless power coupler for a cryogenic environment of claim 1, wherein no electrical conductors couple, through the wall, the first electrically conductive winding to the plurality of second electrically conductive windings.

7. The leadless power coupler for a cryogenic environment of claim 1, wherein the respective loads are located outside of the first thermal insulating system.

8. The leadless power coupler for a cryogenic environment of claim 1, wherein the respective loads comprise a rack-mounted power distribution unit.

9. The leadless power coupler for a cryogenic environment of claim 1, wherein the respective loads comprise a computer.

10. The leadless power coupler for a cryogenic environment of claim 1, wherein the respective loads comprise a superconducting magnet comprising coils of superconducting wire.

11. The leadless power coupler for a cryogenic environment of claim 1, wherein the respective loads comprise a motor.

12. The leadless power coupler for a cryogenic environment of claim 1, wherein the respective loads are configured to normally operate at ambient temperature.

13. The leadless power coupler for a cryogenic environment of claim 1, further comprising a circuit breaker coupled between a second electrically conductive winding in the plurality of second electrically conductive windings and a respective cryogenic rectifier in the plurality of cryogenic rectifiers.

14. The leadless power coupler for a cryogenic environment of claim 1, further comprising a second thermal insulating system, wherein the first electrically conductive winding is located inside of the second thermal insulating system.

15. The leadless power coupler for a cryogenic environment of claim 1, further comprising a frequency upconverter coupled to the first electrically conductive winding and configured to increase a frequency of an alternating current input to the first electrically conductive winding.

16. The leadless power coupler for a cryogenic environment of claim 1, further comprising:
an aircraft wing, wherein at least a portion of the first thermal insulating system is located inside the aircraft wing; and
an aircraft electric propulsion motor, wherein the electric propulsion motor is a respective load in the respective loads.

17. A method for supplying electrical power via a leadless power coupler for a cryogenic environment, comprising:
applying an input alternating current through a first electrically conductive winding to create a varying magnetic field, wherein the first electrically conductive winding is located outside of a thermal insulating system and the thermal insulating system comprises a wall defining a cavity therein;
inducing, using the varying magnetic field, a plurality of output alternating currents in a plurality of respective second electrically conductive windings, wherein the plurality of second electrically conductive windings are located inside the thermal insulating system and the plurality of second electrically conductive windings are in a superconducting state;
rectifying, using a plurality of cryogenic rectifiers, the plurality of output alternating currents into a plurality of respective direct currents, wherein each cryogenic rectifier is coupled to a respective second electrically conductive winding in the plurality of second electrically conductive windings; and
conducting the plurality of respective direct currents to respective loads via a plurality of respective cryogenic cables coupled between respective outputs of the plurality of cryogenic rectifiers and the respective loads, wherein:
the thermal insulating system is configured thermally in a bus topology; and
the first electrically conductive winding, the plurality of second electrically conductive windings, the plurality of cryogenic rectifiers, and the plurality of cryogenic cables are configured electrically in a star topology with the first electrically conductive winding at a center of the star topology.

18. The method of claim 17, further comprising increasing a frequency of the input alternating current prior to applying the input alternating current through the first electrically conductive winding.

19. The method of claim 17, wherein in a respective load in the respective loads is at least one of a superconducting motor or a superconducting generator, and further comprising conducting a respective direct current in the respective direct currents to a brushless exciter of at least one of the superconducting motor or the superconducting generator.

* * * * *

UNITED STATES PATENT AND TRADEMARK OFFICE
CERTIFICATE OF CORRECTION

| | | |
|---|---|---|
| PATENT NO. | : 12,334,253 B2 | Page 1 of 1 |
| APPLICATION NO. | : 17/548589 | |
| DATED | : June 17, 2025 | |
| INVENTOR(S) | : Michael Steurer et al. | |

It is certified that error appears in the above-identified patent and that said Letters Patent is hereby corrected as shown below:

On the Title Page

Item (72) Inventors should read: Michael Steurer, Tallahassee, FL (US);
Lukas Graber, Atlanta, GA (US);
Sastry Pamidi, Tallahassee, FL (US);
Yanjun Shi, Tallahassee, FL (US);
Peter Cheetham, Tallahassee, FL (US);
Chui Han Kim, Tallahassee, FL (US)

Signed and Sealed this
Thirtieth Day of September, 2025

John A. Squires
*Director of the United States Patent and Trademark Office*